United States Patent
Gonthier et al.

(10) Patent No.: US 7,119,497 B2
(45) Date of Patent: Oct. 10, 2006

(54) DIMMER FOR RESISTIVE OR CAPACITIVE LOADS

(75) Inventors: Laurent Gonthier, Tours (FR); Raynald Achart, Pernay (FR)

(73) Assignee: STMicroelectronics S.A., Montrouge (FR)

( * ) Notice: Subject to any disclaimer, the term of this patent is extended or adjusted under 35 U.S.C. 154(b) by 0 days.

(21) Appl. No.: 10/934,137

(22) Filed: Sep. 3, 2004

(65) Prior Publication Data

US 2005/0062441 A1    Mar. 24, 2005

(30) Foreign Application Priority Data

Sep. 4, 2003   (FR)   ................................. 03 50504

(51) Int. Cl.
*H05B 37/00*   (2006.01)

(52) U.S. Cl. ...................................... 315/291; 315/224

(58) Field of Classification Search ................ 315/291, 315/224, 225, 307, 244, 219, 209 CD, 209 R, 315/247, 240, 246

See application file for complete search history.

(56) References Cited

U.S. PATENT DOCUMENTS

| | | | | |
|---|---|---|---|---|
| 4,520,295 A | * | 5/1985 | Bolhuis | 315/291 |
| 5,796,599 A | * | 8/1998 | Raonic et al. | 363/57 |
| 6,724,157 B1 | * | 4/2004 | Kazanov et al. | 315/291 |
| 6,900,601 B1 | * | 5/2005 | Peron | 315/291 |

* cited by examiner

*Primary Examiner*—Wilson Lee
(74) *Attorney, Agent, or Firm*—Lisa K. Jorgenson; James H. Morris; Wolf, Greenfield & Sacks, P.C.

(57) ABSTRACT

A power dimmer for an A.C. load comprising, between two terminals, two one-way switches connected in anti-parallel and controllable to be turned off and turned on, each switch being controlled by a driver circuit setting the turn-off times of each of the switches with respect to a reference value, each driver circuit being associated with a supply circuit comprising a voltage storage element in series with a one-way rectifying element, all in parallel with a voltage-limiting element, the two supply circuits being connected to each other by a capacitor and the respective supply voltages of the driver circuits being sampled across the respective capacitors of each supply circuit.

8 Claims, 1 Drawing Sheet

DIMMER FOR RESISTIVE OR CAPACITIVE LOADS

BACKGROUND OF THE INVENTION

1. Field of the Invention

The present invention relates to the field of power dimmers which are intended to adjust the A.C. supply power of resistive or capacitive loads.

2. Discussion of the Related Art

A first known category of dimmers is based on the use of triacs, the triggering delay of which is varied according to the beginning of the halfwaves of the A.C. power supply. Such dimmers do not work with capacitive loads.

A second category to which the present invention applies relates to dimmers using switches, the turn-off delay of which is controlled and which are thus on at the beginning of each halfwave of the power supply. Such dimmers require lockable switches, for example, two MOS transistors respectively assigned to the positive and negative halfwaves of the A.C. power supply. Such dimmers require, for each of the MOS transistor control amplifiers, dedicated supply circuits, which increases the circuit cost. Further, the use of MOS transistors poses electro-magnetic compatibility problems as well as forward voltage problems when the two transistors are in anti-series.

To solve this last problem, it has already been provided to use another category of switches, that is, so-called MBS transistors which correspond to IGBT transistors holding the reverse voltage (reverse blocking IGBT).

FIG. 1 shows a conventional example of such a dimmer. A load (for example, a lamp L) is connected in series with a power dimmer 1 between two terminals P and N of application of an A.C. supply voltage. Circuit 1 is based on the use of two MBS transistors 2 and 3 connected in antiparallel between two terminals 4 and 5 of the dimmer, respectively connected to lamp L and to terminal N. In this example, transistor 2 has its emitter on the side of terminal 4 and transistor 3 has its emitter on the side of terminal 5. Each MBS is controlled by a circuit 6, 7 (DRIV) specific thereto. Such drivers 6, 7 generally comprise a comparator associated with a detector of the zero crossing of the A.C. voltage, connected to delay the MBS blocking with respect to the zero crossing according to a reference value. The power reference value is provided, for example, by a potentiometer 11 on the side of circuit 7. This reference is transferred from circuit 7 to circuit 6 by an optocoupler 10, which is necessary due the reference voltage difference between circuits 6 and 7.

Each circuit 6, respectively 7, is supplied by a circuit (PSC) 8, respectively 9. Such circuits 8 and 9 are known, for example, under trade name VIPER. These are integrated circuits or circuits with discrete elements which, in the connection of FIG. 1, are each associated with a capacitor C8, respectively C9, across which the supply voltage intended for driver 6, respectively 7 is sampled. Circuit 8 further comprises, in series between the electrode of capacitor C8 opposite to terminal 4 and terminal N, a resistor R8, a MOS transistor T8, and a diode D8. Circuit 9 comprises, between the electrode of capacitor C9 opposite to terminal N and terminal 4, a resistor R9, a MOS transistor T9, and a diode D9. Such connections based on VIPER circuits are known.

A disadvantage of a structure such as illustrated in FIG. 1 is that it requires two separate complex supply circuits for circuits 6 and 7.

SUMMARY OF THE INVENTION

The present invention aims at overcoming the disadvantages of known dimmers based on IGBT or MBS transistors. More specifically, the present invention aims at providing a novel supply circuit structure for such a dimmer.

To achieve these and other objects, the present invention provides a power dimmer for an A.C. load comprising, between two terminals, two one-way switches connected in anti-parallel and controllable to be turned off and turned on, each switch being controlled by a driver circuit setting the turn-off times of each of the switches with respect to a reference value, each driver circuit being associated with a supply circuit comprising a voltage storage element in series with a one-way rectifying element, all in parallel with a voltage-limiting element, the two supply circuits being connected to each other by a capacitor and the respective supply voltages of the driver circuits being sampled across the respective capacitors of each supply circuit.

According to an embodiment of the present invention, the respective voltage-limiting elements set the supply voltages of the driver circuits.

According to an embodiment of the present invention, a resistor is interposed in series with the capacitor between the two supply circuits.

According to an embodiment of the present invention, the power reference is communicated from a driver circuit to another by an optocoupler.

According to an embodiment of the present invention, the power reference is set by a potentiometer with isolated double tracks, shared by the two driver circuits.

According to an embodiment of the present invention, the voltage-limiting elements are zener diodes.

According to an embodiment of the present invention, the rectifying elements are diodes.

According to an embodiment of the present invention, the voltage storage elements are capacitors.

The foregoing objects, features, and advantages of the present invention will be discussed in detail in the following non-limiting description of specific embodiments in connection with the accompanying drawings.

DETAILED DESCRIPTION

Figure 1:
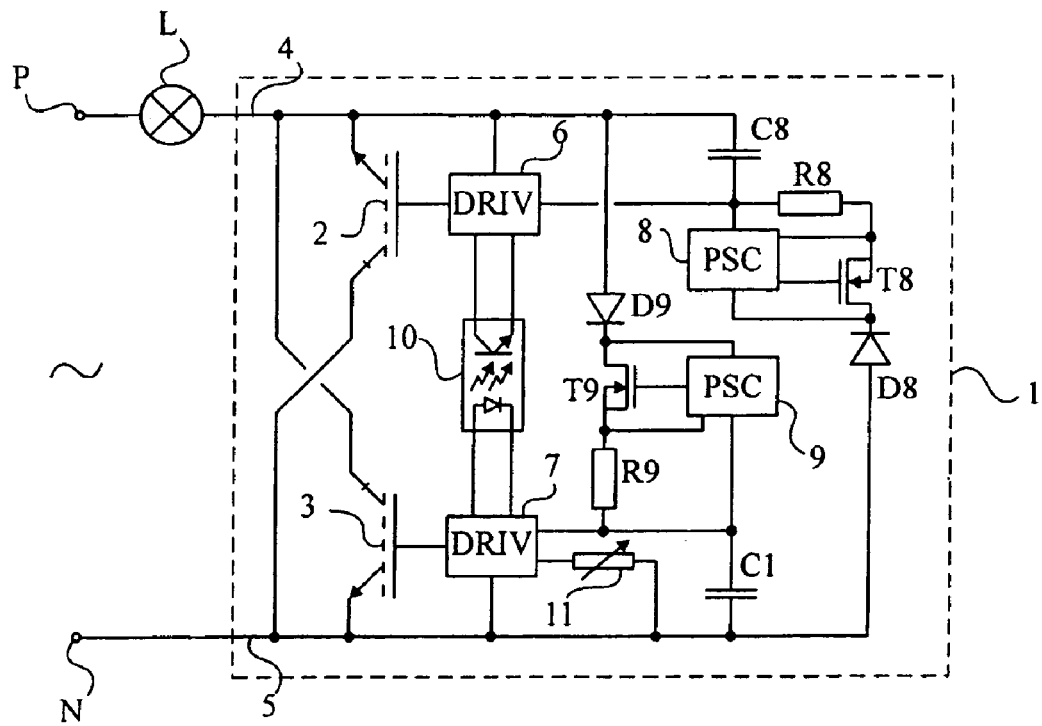
FIG. 1, previously described, shows a conventional example of a power dimmer based on MBS transistors.

Same elements have been designated with same reference numerals in the different drawings. For clarity, only those elements which are necessary to the understanding of the present invention have been shown in the drawings and will be described hereafter. In particular, the load supplied by the dimmer has not been detailed. The present invention applies whatever the type of resistive or capacitive load to be supplied. Further, the internal structures of the control circuits have not been detailed when already known.

A feature of the present invention is to provide a supply circuit based on passive components for the driver circuits of two MBS transistors connected in antiparallel in a power dimmer structure.

Figure 2:
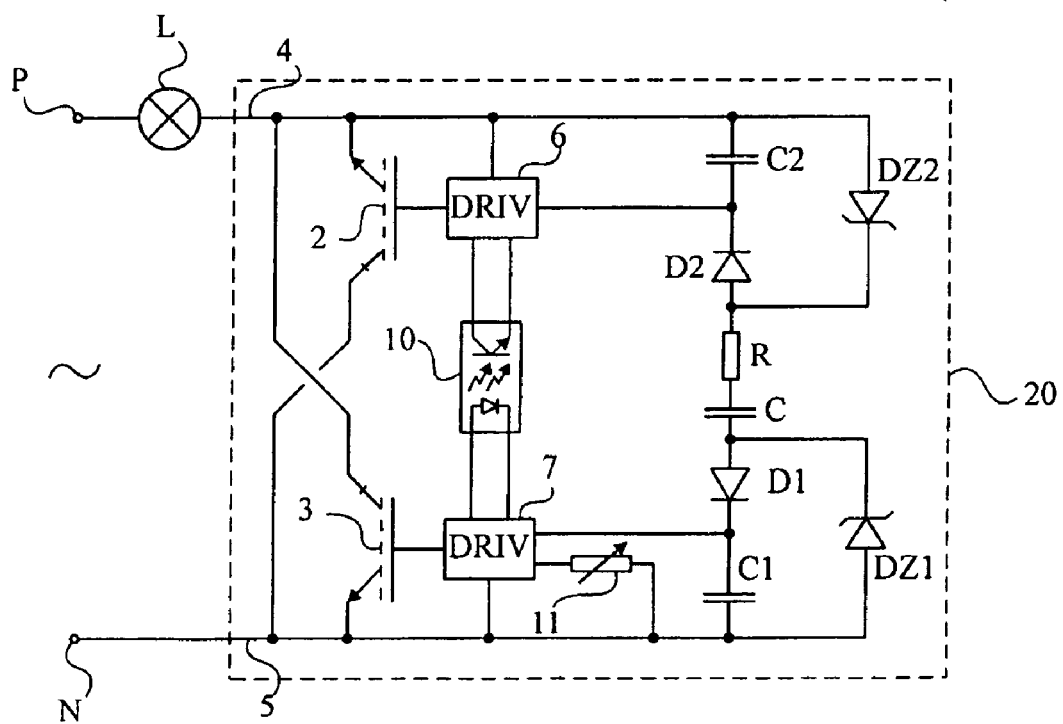
FIG. 2 shows an embodiment of a power dimmer according to the present invention.

FIG. 2 shows, in a view to be compared with FIG. 1, an embodiment of a power dimmer according to the present invention. It shows a load L series-connected with a dimmer circuit 20, between two terminals P and N of application of an A.C. supply voltage.

As previously, dimmer 20 comprises two transistors 2 and 3 connected in antiparallel between two terminals 4 and 5 respectively connected to load L and to terminal N. Transistors 3 and 4 are, preferably, MBS transistors (IGBT with a reverse voltage hold). As an alternative, each of the MBS transistors may be replaced with a MOS transistor or an IGBT transistor associated with a diode in series to have it hold the reverse voltage. Each transistor 2, 3 is controlled by a conventional driver circuit 6, 7 (DRIV). In the example of FIG. 2, the power reference set by a potentiometer 11 at the level of circuit 7 is, as in the case of FIG. 1, transferred to circuit 6 by means of an optocoupler 10. As an alternative, other types of reference power transfer may be provided. For example, a potentiometer with isolated double tracks may be used between circuits 6 and 7.

According to the present invention, the supply voltage of each circuit 6 or 7 is provided by a capacitor, respectively C2 or C1. Each capacitor C1, C2 has a first electrode connected to terminal 5, respectively 4 of the dimmer and a second electrode connected to a supply input terminal of driver circuit 7, respectively 6. This second electrode of each capacitor is further connected to the cathode of a diode D1, respectively D2 (or of any other one-way rectifying element) having its anode connected to the other capacitor electrode via a zener diode DZ1, respectively DZ2 (or any other voltage-limiting element) having its threshold voltage conditioning the supply voltage desired across the concerned storage capacitor. Preferably, the two diodes DZ1 and DZ2 thus have the same values since the driver circuits are supplied with a similar voltage. Finally, the respective anodes of diodes D1 and D2 are connected to each other through a capacitor C in series with a resistor R. In the supply assembly, only capacitor C is a high-voltage capacitor. Resistor R has the function of limiting the current.

The supply circuit operates as follows. On positive halfwaves arbitrarily defined as halfwaves where the voltage of terminal P is greater than the voltage of terminal N, diode DZ2 having its anode on the side of terminal 4 then conducts while diode D2 is blocked. Further, diode D1 is forward-biased while diode DZ1 is reverse-biased. Accordingly, capacitor C1 charges through path DZ2-R-C-D1 until the threshold voltage of diode DZ1 has been reached. The latter then limits the voltage to this threshold voltage. On negative halfwaves, diode D1 is blocked while diode DZ1 is forward-biased. Capacitor C2 then charges through path DZ1-C-R-D2, the value of this charge being limited by diode DZ2. It should be noted that the presence of diode D1 prevents the discharge of capacitor C1 during negative halfwaves in the same way as diode D2 prevents the discharge of capacitor C2 during positive halfwaves.

An advantage of the present invention is that its structure is considerably simpler than that of FIG. 1.

Another advantage of the present invention is that, especially due to the presence of resistor R and of capacitor C useful in all the A.C. supply halfwaves, it improves the symmetry of the supply current consumption.

Another advantage of the present invention is that capacitor C behaves as a switching aid component or snubber, which enables reducing general circuit losses and in particular the power dissipated by switches 2 and 3.

Another advantage of the present invention is that its structure is suited to an optocoupler-less control of driver circuits 6 and 7.

Of course, the present invention is likely to have various alterations, modifications, and improvements which will readily occur to those skilled in the art. In particular, the sizing to be given to the different components of the supply circuit are within the abilities of those skilled in the art based on the functional indications given hereabove and according to the application.

Such alterations, modifications, and improvements are intended to be part of this disclosure, and are intended to be within the spirit and the scope of the present invention. Accordingly, the foregoing description is by way of example only and is not intended to be limiting. The present invention is limited only as defined in the following claims and the equivalents thereto.

What is claimed is:

1. A power dimmer for an A.C. load comprising, between two terminals, two one-way switches connected in antiparallel and controllable to the off and on states, each switch being controlled by a driver circuit setting the turn-off times of each of the switches with respect to a reference value, wherein each driver circuit is associated with a supply circuit comprising:
   a voltage storage element;
   a diode in series with said storage element;
   a voltage-limiting element in parallel with the serial connection of said storage element and said diode, the two supply circuits being connected to each other by a capacitor and the respective supply voltages of the driver circuits being provided across the respective capacitors of each supply circuit.

2. The dimmer of claim 1, wherein the respective voltage-limiting elements set the supply voltages of the driver circuits.

3. The dimmer of claim 1, wherein a resistor is interposed in series with the capacitor between the two supply circuits.

4. The dimmer of claim 1, wherein the power reference is communicated from a driver circuit to another by an optocoupler.

5. The dimmer of claim 1, wherein the power reference is set by a potentiometer with isolated double tracks, shared by the two driver circuits.

6. The dimmer of claim 1, wherein the voltage-limiting elements are zener diodes.

7. The dimmer of claim 1, wherein the diodes only conduct during respective half-cycles of an A.C. signal.

8. The dimmer of claim 1, wherein the voltage storage elements are capacitors.

* * * * *